United States Patent
Piccardo et al.

(10) Patent No.: US 10,241,135 B2
(45) Date of Patent: Mar. 26, 2019

(54) METHOD, TOOL AND SYSTEM FOR ADJUSTING THE ACCURACY OF A VOLTAGE DIVIDER

(71) Applicant: SIEMENS AKTIENGESELLSCHAFT, Munich (DE)

(72) Inventors: Francesco Piccardo, Albisola SV (IT); Marino Piuma, Vado Ligure SV (IT)

(73) Assignee: Siemens Aktiengesellschaft, Munich (DE)

( * ) Notice: Subject to any disclaimer, the term of this patent is extended or adjusted under 35 U.S.C. 154(b) by 138 days.

(21) Appl. No.: 15/316,262

(22) PCT Filed: May 12, 2015

(86) PCT No.: PCT/EP2015/060423
§ 371 (c)(1),
(2) Date: Dec. 5, 2016

(87) PCT Pub. No.: WO2015/185332
PCT Pub. Date: Dec. 10, 2015

(65) Prior Publication Data
US 2017/0153276 A1    Jun. 1, 2017

(30) Foreign Application Priority Data

Jun. 5, 2014 (EP) .................................. 14171376

(51) Int. Cl.
*G01R 15/04*      (2006.01)
*G01R 35/00*      (2006.01)

(52) U.S. Cl.
CPC ........... *G01R 15/04* (2013.01); *G01R 35/005* (2013.01)

(58) Field of Classification Search
CPC ......... H02M 1/088; H02M 2001/0077; H02M 3/3376; H02M 7/003; H02M 7/49;
(Continued)

(56) References Cited

U.S. PATENT DOCUMENTS

| 2,803,799 A | * | 8/1957 | Siegel et al. ............. | H03H 7/24<br>324/601 |
| 3,324,390 A | * | 6/1967 | O'Leary .................. | G01R 1/28<br>324/103 R |

(Continued)

FOREIGN PATENT DOCUMENTS

WO      2013026805 A1      2/2013

OTHER PUBLICATIONS

F. Piccardo, D. Santinelli; Trench Italia s.r.l.: "Resistive-Capacitive Voltage Divider type RCVD 420 for 8DQ1 Gas Insulated Switchgear 420kV".

*Primary Examiner* — Vinh P Nguyen
(74) *Attorney, Agent, or Firm* — Laurence Greenberg; Werner Stemer; Ralph Locher

(57) ABSTRACT

A method, an adjusting tool system and an accuracy adjustment system are provided for faster and more reliable adjustment of a HV-divider. A secondary unit includes a plurality of electronic components for adjusting a dividing ratio of the voltage divider. The adjusting tool system is connected to the secondary unit. The adjusting tool system evaluates the accuracy of the voltage divider for a plurality of circuit configurations. A circuit configuration interconnects a subset of the electronic components to generate an electronic circuit that influences the dividing ratio of the voltage divider. A circuit configuration that results in a sufficiently accurate dividing ratio is selected. A connector is programmed by the adjusting tool system in such a way that the secondary unit establishes the selected one of the circuits (Continued)

when the connector is connected to the secondary unit. Preferably, the connector is programmed by burning fuses within the connector.

13 Claims, 4 Drawing Sheets

(58) Field of Classification Search
CPC .. H02M 3/07; H02M 1/36; H02M 2001/0093; H02M 3/155; H02M 7/1626; G11C 16/30; G11C 5/146; G11C 5/147; G11C 27/024; G01R 15/04; G01R 19/0084; G01R 19/02; G01R 21/133; G01R 21/14; G01R 35/04; G01R 15/06; G01R 17/06; G01R 19/2506; G01R 27/02; G01R 33/381; G01R 35/005; G01R 19/0038
See application file for complete search history.

(56) References Cited

U.S. PATENT DOCUMENTS

| | | | | |
|---|---|---|---|---|
| 3,377,555 A | * | 4/1968 | Lewis | G01R 1/203 |
| | | | | 324/601 |
| 3,886,448 A | * | 5/1975 | Drabenko | G01R 15/04 |
| | | | | 324/704 |
| 4,950,979 A | * | 8/1990 | Stegmuller | G01R 15/04 |
| | | | | 174/139 |
| 9,331,662 B2 | | 5/2016 | Nabielec | |
| 2010/0225304 A1 | | 9/2010 | Wynne | |
| 2013/0113507 A1 | | 5/2013 | Danesh et al. | |

\* cited by examiner

METHOD, TOOL AND SYSTEM FOR ADJUSTING THE ACCURACY OF A VOLTAGE DIVIDER

BACKGROUND OF THE INVENTION

Field of the Invention

The invention relates to the technical field of accuracy adjustment of voltage dividers.

High voltage dividers (HV-dividers) are used to transform a high voltage to a low voltage, in order to perform precise measurements of the high voltage. The active part of a voltage divider has unavoidable physical tolerances. In order to achieve a requested accuracy of the dividing ratio of the voltage divider, an adjustment of the secondary components is necessary. Secondary components usually comprise resistors and capacitors. Such an adjustment of the secondary components usually requires manual measurements and replacement of components. This is time consuming.

BRIEF SUMMARY OF THE INVENTION

It is therefore an objective of the invention to allow less time consuming adjustment of the accuracy of a voltage divider.

This objective is solved by the solution as described by the independent claims. The dependent claims describe advantageous embodiments of the invention.

According to an aspect of the invention, a method for adjusting the accuracy of a voltage divider is provided. The accuracy of the voltage divider is adjusted by means of a secondary unit. The secondary unit is connected to the voltage divider. The secondary unit comprises a plurality of electronic components for adjusting a dividing ratio of the voltage divider. In a method step an adjusting tool system is connected to the secondary unit. The adjusting tool system evaluates the accuracy of the voltage divider for a plurality of circuit configurations. A circuit configuration is defined in that it interconnects a subset of the electronic components in order to generate an electronic circuit that influences the dividing ratio of the voltage divider. In a further method step one of the circuit configurations that results in a sufficiently accurate dividing ratio is selected. In yet a further method step a connector is programmed by the adjusting tool system such that the secondary unit establishes the selected one of the circuits when the connector is connected to the secondary unit.

According to another aspect, an adjusting tool system for adjusting the accuracy of a voltage divider is proposed. The accuracy of the voltage divider is adjusted by means of a secondary unit to be connected to the divider. The adjusting tool system comprises a tool plug, an evaluating means 35, a selecting means 36, and a programming means 37. The tool plug is adapted to connect the adjusting tool system to a secondary unit. The evaluating means 35 are adapted to evaluate the accuracy of the voltage divider for a plurality of circuit configurations, wherein a circuit configuration interconnects at least a part of electronic components of the secondary unit in order to generate an electronic circuit that influences the dividing ratio of the voltage divider. The selecting means 36 are adapted to select one of the circuit configurations that results in a sufficiently accurate dividing ratio. The programming means 37 are adapted to program a convector such that the secondary unit establishes the selected one of the circuits when the connector is connected to the secondary unit.

According to another aspect an accuracy adjustment system is proposed. The accuracy adjustment system comprises the adjusting tool system as described in the previous paragraph, the secondary unit, and the connector.

BRIEF DESCRIPTION OF THE SEVERAL VIEWS OF THE DRAWING

The invention is in the following described on the basis of the figures illustrating preferred embodiments.

DESCRIPTION OF THE INVENTION

Figure 1:
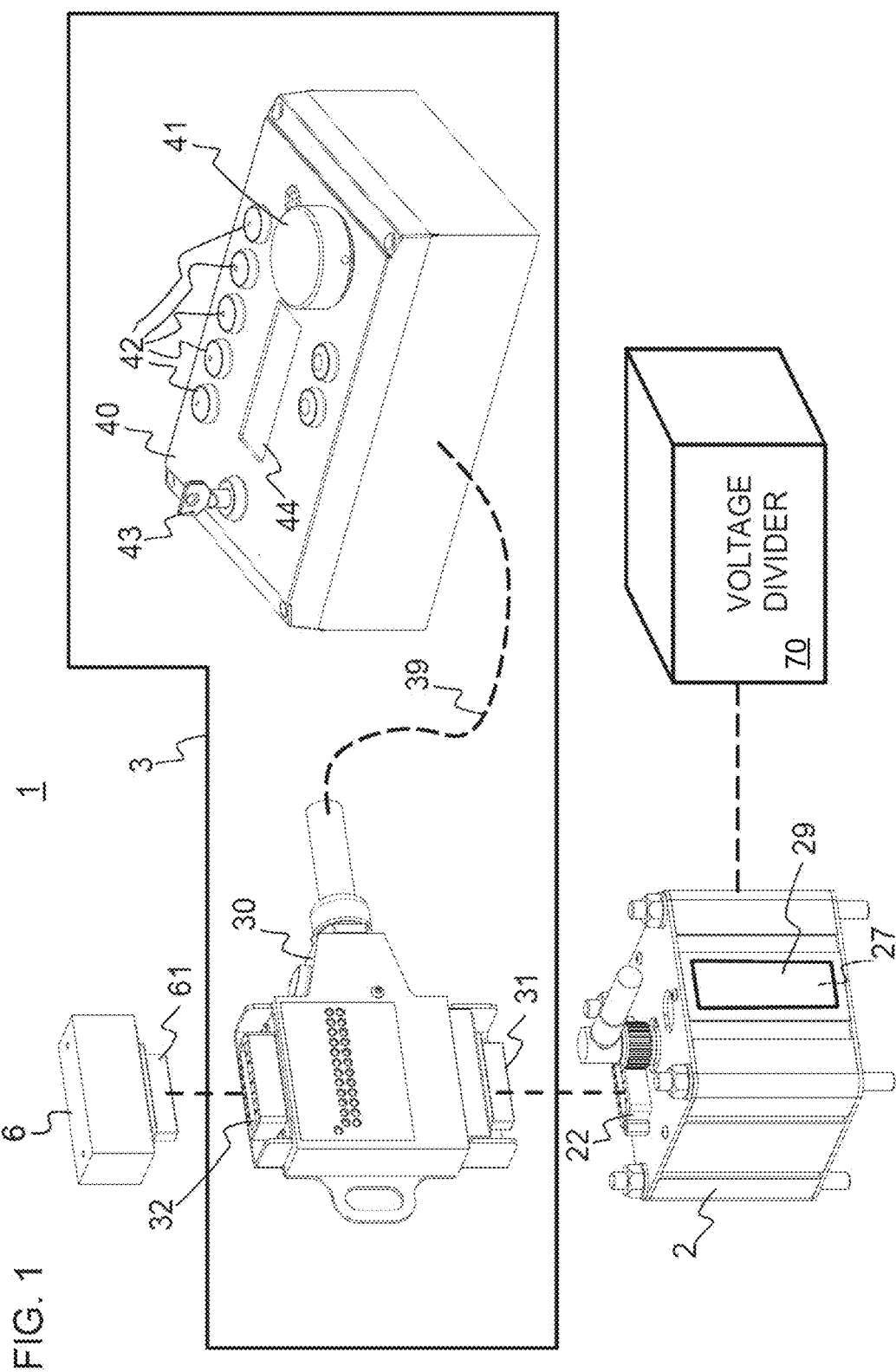
FIG. 1 shows an accuracy adjustment system.

FIG. 1 shows a preferred embodiment of an accuracy adjustment system 1 for efficiently adjusting the accuracy of a HV-divider 70. The system 1 comprises an adjustable secondary unit 2, an adjusting tool system 3, and a programmable connector 6.

The secondary unit 2 comprises a plurality of electronic components 29 for adjusting a dividing ratio of the HV-divider, such as capacitors and resistors. Furthermore, the secondary unit 2 comprises a plug 22, which is also called unit plug 22, permanently connected to the plurality of electronic components of the secondary unit.

The adjusting tool system 3 comprises testing equipment components such as an adjusting tool 30 and an adjusting console 40. The adjusting tool 30 and the adjusting console 40 are connected via an opto-insulated link 39. The adjusting console 40 comprises an adjusting knob 41, a plurality of function buttons 42, a power on/off key 43, and an information display 44. The adjusting tool 30 comprises a tool plug 31 and a second tool plug 32.

The connector 6 is programmable such that it is writable only once. The connector 6 is also called connector key. The connector 6 comprises a connector plug 61. The connector plug 61 matches both, the second tool plug 32 of the adjusting tool system 3, and the unit plug 22 of the secondary unit 2. The tool plug 31 of the adjusting tool system 3 matches the plug 22 of the secondary unit 2.

FIGS. 2A to 2D illustrate on the basis of an adjusting procedure sequence a method for adjusting the accuracy of a HV-divider by means of a secondary unit 2 connected to the HV-divider.

Figure 2A:
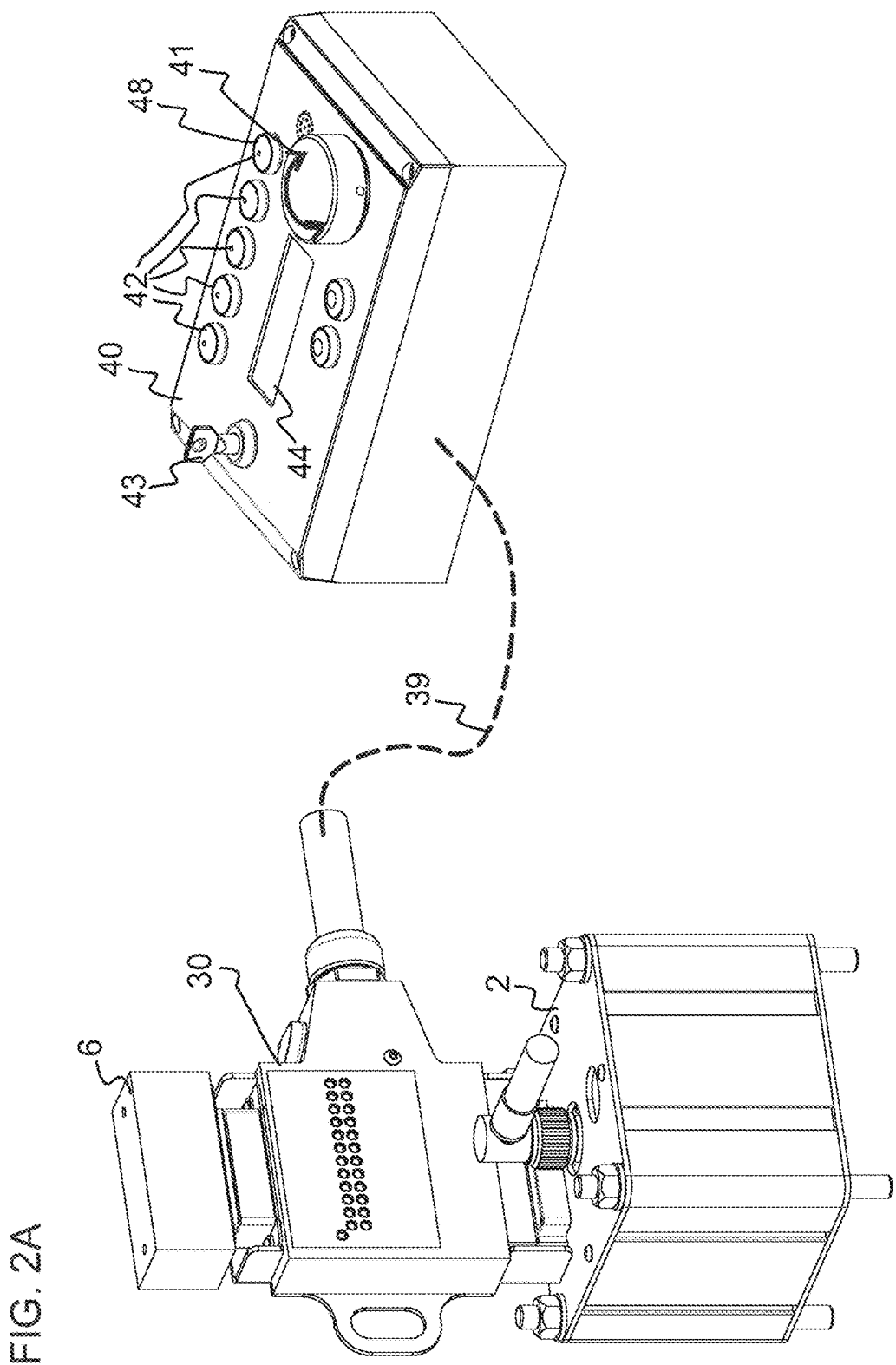
FIGS. 2A to 2D illustrate an adjusting procedure sequence that can be applied to the accuracy adjustment system of FIG. 1.

In FIG. 2A the adjusting tool 30 is connected to the secondary unit 2, and the connector 6 is connected to the adjusting tool 30. During the routine error measurements the adjusting knob 41 on the console 40 is actuated until the required accuracy is achieved. Preferably, the setting with the most accurate dividing ratio is chosen. While actuating the knob 41, the adjusting tool system 3 evaluates the accuracy of the HV-divider for a plurality of circuit configurations. When the required accuracy is achieved, the programming button 48 is pressed. The adjusting tool system 3 then programs the connector 6 by burning fuses in the connector 3. This might take e.g. about 5 seconds. The display 44 will confirm when the programming is done.

Figure 2D:
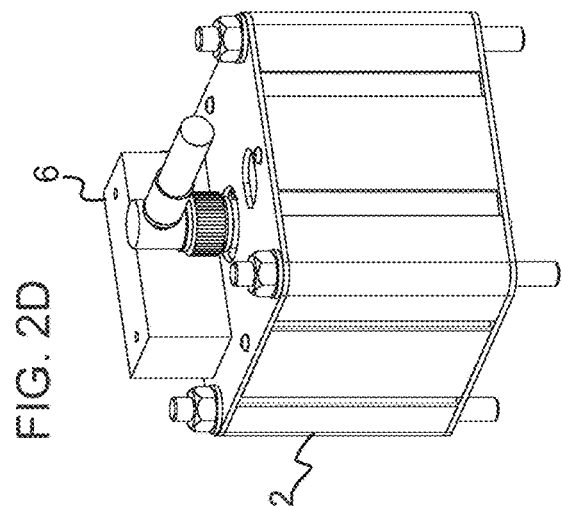
Figure 2C:
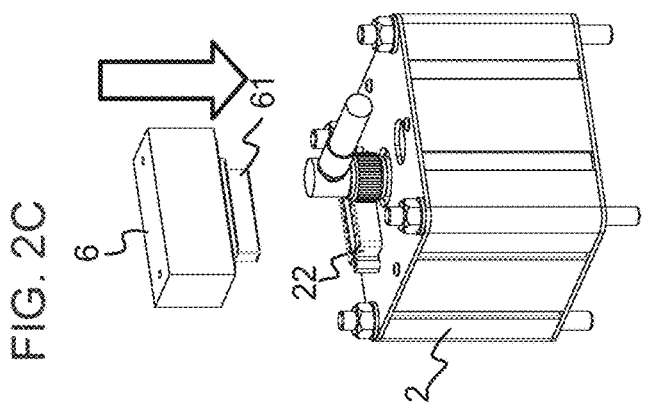
Figure 2B:
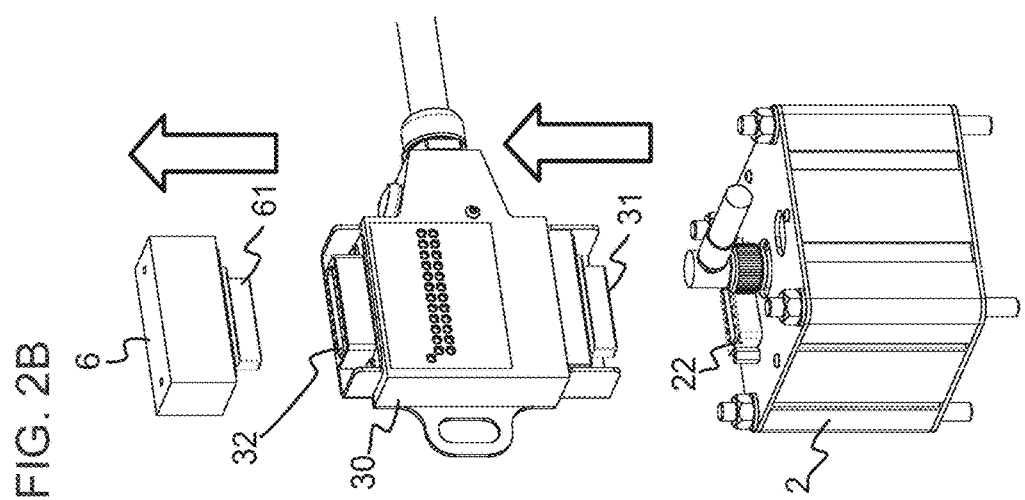

FIG. 2B illustrates a method step in the course of which the programmed connector key 6 is removed from the adjusting tool 30. Furthermore, the adjusting tool 30 is removed from the secondary unit 2.

FIG. 2C illustrates a method step in the course of which the programmed connector key 6 is directly connected to the adjustable secondary unit 2. The HV-divider, together with the secondary unit and the connector key 6 connected to the secondary unit should now be sufficiently accurate. In order to ensure this, as illustrated in FIG. 2D, the error measurements are repeated and it is verified that the errors are compliant with the requirements.

Figure 3:
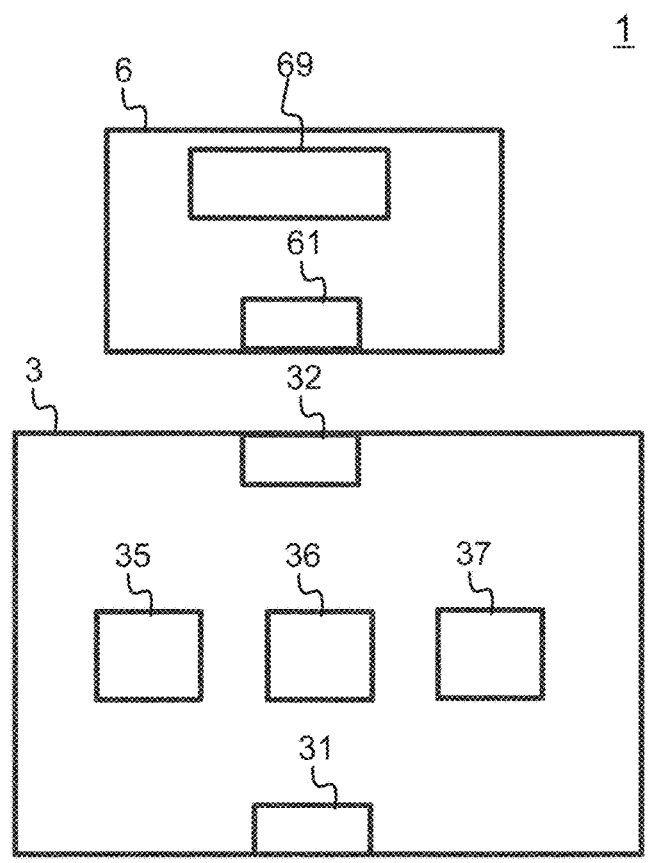
FIG. 3 shows a block diagram of the accuracy adjustment system of FIG. 1.
Figure 3:
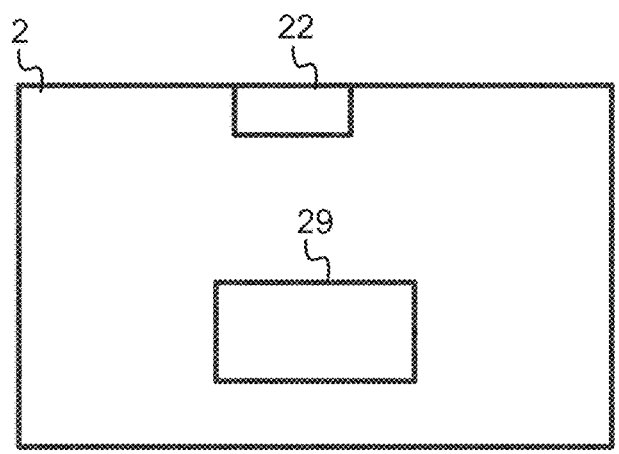

FIG. 3 shows a block diagram of the accuracy adjustment system 1 of FIG. 1. The accuracy adjustment system 1 comprises the adjusting tool system 3, the secondary unit 2, and the connector 6.

The secondary unit 2 comprises the plurality of electronic components 29, such as capacitors and resistors. The secondary unit 2 also comprises unit plug 22 for connecting the plurality of electronic components 29 to an external circuit 3, 6.

The adjusting tool system 3 comprises the tool plug 31, evaluating means 35, selecting means 36 including the button 48, and programming means 37. The tool plug is adapted for connecting the adjusting tool system 3 to a secondary unit 2. The evaluating means 35 are adapted for evaluating the accuracy of the voltage divider for a plurality of circuit configurations 27. Each circuit configuration interconnects at least a subset of the plurality of electronic components 29 in order to generate an electronic circuit that influences the dividing ratio of the voltage divider. The selecting means 36 are adapted for selecting one of the circuit configurations resulting in a sufficiently accurate dividing ratio.

The programming means 37 are adapted for programming the convector 6 such that the secondary unit 2 establishes the selected one of the circuits when the connector 6 is connected to the secondary unit 2.

The programming means 37 are adapted to program the connector 6 by burning at least a part of a plurality of fuses 69 within the connector 6.

The adjusting tool system 3 is adapted to evaluate the plurality of circuit configurations by generating each one of the circuit configurations. Therefore, the adjusting tool system 3 connects a selection of the plurality of fuses 69 of the connector 6 to a selection of the plurality of electronic components 29.

According to a preferred embodiment, a method for adjusting the accuracy of a voltage divider by means of a secondary unit 2 to be connected to the voltage divider is proposed. The secondary unit 2 comprises a plurality of electronic components 29 for adjusting a dividing ratio of the voltage divider. In a method step, the adjusting tool system 3 is connected to the secondary unit 2. The the adjusting tool system 3 evaluates the accuracy of the voltage divider for a plurality of circuit configurations. A circuit configuration interconnects at least a subset of the electronic components in order to generate an electronic circuit that influences the dividing ratio of the voltage divider. In a further method step, one of the circuit configurations that results in a sufficiently accurate dividing ratio is selected by the adjusting tool system 3. In yet a further method step, a connector 6 is programmed by the adjusting tool system 3 such that the secondary unit 2 establishes the selected one of the circuits when the connector 6 is connected to the secondary unit 2. This solution results in the advantage that no manual adjustment and replacement is needed. The process of adjusting the divider is therefore faster, and also more reliable.

According to a preferred embodiment the connector 6 comprises a partial circuit. The partial circuit comprises a plurality of fuses 69. The connector 6 is programmed by burning at least a part of the plurality of fuses 69. The fuses that are to be burnt are the fuses that are not used for the selected one of the circuit configurations. This solution represents a particularly fast and reliable programming of the connector.

According to a preferred embodiment, the connector 6 is connected to the adjusting tool system 3. The plurality of circuit configurations is then evaluated by generating each one of the circuit configurations in that the adjusting tool system 3 connects a selection of the fuses to a selection of the electronic components. This solution represents a particularly fast and reliable programming of the connector.

According to a preferred embodiment, after having selected the one of the circuit configurations, and preferably after having programmed the connector 6, the adjusting tool system 3 is disconnected from the secondary unit 2, and the proframmed connector 6 is directly connected to the secondary unit 2. This way only a minimum of plugs is required.

According to a preferred embodiment, the plurality of electronic components 29 of the secondary unit 2 comprises a plurality of capacitors and resistors.

According to a preferred embodiment, the secondary unit 2 comprises a unit plug 22 for connecting the plurality of electronic components to an external circuit. The adjusting tool system 3 is connected to the secondary unit via said unit plug 22 in order to have the adjusting tool system 3 evaluated the accuracy of the voltage divider for a plurality of circuit configurations. After the adjusting tool system 3 has programmed the connector 6, the connector 6 is connected to the secondary unit 2 via said unit plug 22. This allows to use the connector for the simulation, requires only a minimum of plugs.

According to a preferred embodiment, the secondary unit 2 comprises various values of capacitors and resistors in order to cover all possible values potentially needed. The connector 6 comprises fuses. The fuses 69 can be opened by the adjusting tool system. Thus, electronic components of the plurality of electronic components 29 of the secondary unit 2 can be connected or disconnected. The adjusting tool system 3 combines circuit configurations of the components until a desired value for the dividing ratio of the divider is reached. Then the fuses of unneeded components are burned, in order to program the connector.

According to preferred embodiments, in order to provide for faster and more reliable adjustment of a HV-divider, a secondary unit 2 comprises a plurality of electronic components 29 for adjusting a dividing ratio of the voltage divider. An adjusting tool system 3 is connected to the secondary unit 2. The adjusting tool system 3 evaluates the accuracy of the voltage divider for a plurality of circuit configurations, wherein a circuit configuration interconnects a subset of the electronic components 29 in order to generate an electronic circuit that influences the dividing ratio of the voltage divider. A circuit configuration that results in a sufficiently accurate dividing ratio is selected. A connector 6 is programmed by the adjusting tool system 3 such that the secondary unit 2 establishes the selected one of the circuits when the connector 6 is connected to the secondary unit 2. Preferably, the connector 2 is programmed by burning fuses within the connector 6.

The invention claimed is:

1. A method for adjusting the accuracy of a voltage divider, the method comprising the following steps:

a) providing a secondary unit to be connected to the voltage divider, the secondary unit including a plurality of electronic components for adjusting a dividing ratio of the voltage divider;
b) connecting an adjusting tool system to the secondary unit using the adjusting tool system to evaluate an accuracy of the voltage divider for a plurality of circuit configurations, each circuit configuration of said plurality of circuit configurations obtained by interconnecting a subset of said plurality of electronic components, and using a circuit configuration of said plurality of circuit configurations to influence the dividing ratio of the voltage divider;
c) selecting one of the circuit configurations resulting in a sufficiently accurate dividing ratio; and
d) using the adjusting tool system to program a connector and causing the secondary unit to establish the selected one of the circuit configurations when the connector is connected to the secondary unit.

2. The method according to claim 1, which further comprises providing the connector with a partial circuit including a plurality of fuses, and carrying out step d) for programming the connector by burning at least a part of the plurality of fuses within the connector.

3. The method according to claim 2, which further comprises carrying out step b) by connecting the connector to the adjusting tool system, and evaluating the plurality of circuit configurations by generating each one of the circuit configurations by using the adjusting tool system to connect a selection of the fuses to a selection of the plurality of electronic components and determining which one of the generated circuit configurations results in a desired value for the dividing ratio.

4. The method according to claim 1, which further comprises after having selected the one of the circuit configurations, and after having programmed the connector, disconnecting the adjusting tool system from the secondary unit and directly connecting the programmed connector to the secondary unit.

5. The method according to claim 1, wherein the plurality of electronic components of the secondary unit includes a plurality of capacitors and resistors.

6. The method according to claim 1, which further comprises providing the secondary unit with a unit plug for connecting the plurality of electronic components to an external circuit, performing step b) by connecting the adjusting tool system to the secondary unit through the unit plug, and after carrying out step d) by programming the connector, connecting the connector to the secondary unit through the unit plug.

7. An adjusting tool system for adjusting the accuracy of a voltage divider by using a secondary unit to be connected to the voltage divider, the adjusting tool system comprising:
a tool plug for connecting the adjusting tool system to the secondary unit;
an evaluating device for evaluating the accuracy of the voltage divider for a plurality of circuit configurations, each circuit configuration of said plurality of circuit configurations obtained by interconnecting a subset of a plurality of electronic components of the secondary unit to generate an electronic circuit influencing a dividing ratio of the voltage divider;
a selecting device for selecting one of the circuit configurations resulting in a sufficiently accurate dividing ratio; and
a programming device for programming a connector causing the secondary unit to establish the selected one of the circuit configurations when the connector is connected to the secondary unit.

8. The adjusting tool system according to claim 7, wherein said programming device is adapted to program the connector by burning at least a part of a plurality of fuses within the connector.

9. The adjusting tool system according to claim 7, which further comprises:
a further tool plug for connecting the adjusting tool system to the connector; and
the adjusting tool system being adapted to evaluate the plurality of circuit configurations by generating each one of the circuit configurations by using the adjusting tool system to connect a selection of fuses of the connector to a selection of the electronic components and by determining which one of the generated circuit configurations results in a desired value for the dividing ratio.

10. The adjusting tool system according to claim 7, wherein said tool plug matches said further tool plug.

11. An accuracy adjustment system, comprising:
a secondary unit to be connected to a voltage divider, said secondary unit including a plurality of electronic components to be connected in circuit configurations;
a connector; and
an adjusting tool system for adjusting an accuracy of the voltage divider, said adjusting tool system including:
a tool plug for connecting said adjusting tool system to said secondary unit;
an evaluating device for evaluating an accuracy of the voltage divider for a plurality of circuit configurations, each circuit configuration of said plurality of circuit configurations obtained by interconnecting a subset of said plurality of electronic components to generate an electronic circuit influencing a dividing ratio of the voltage divider;
a selecting device for selecting one of said circuit configurations resulting in a sufficiently accurate dividing ratio; and
a programming device for programming said connector, causing said secondary unit to establish said selected one of said circuit configurations when said connector is connected to said secondary unit.

12. The adjustment system according to claim 11, wherein said plurality of electronic components of said secondary unit includes a plurality of capacitors and resistors.

13. The adjustment system according to claim 11, wherein:
said secondary unit includes a unit plug for connecting said plurality of electronic components to an external circuit; and
said adjusting tool system is connectable to said secondary unit directly or through said unit plug.

* * * * *